United States Patent [19]

Flint et al.

[11] Patent Number: 4,459,475
[45] Date of Patent: Jul. 10, 1984

[54] AUTOMATIC CALIBRATION FOR D.C. TRANSDUCERS

[75] Inventors: John R. Flint, Barrington; Robert F. Johnston, Wildwood, both of Ill.

[73] Assignee: Bell & Howell Company, Chicago, Ill.

[21] Appl. No.: 363,181

[22] Filed: Mar. 29, 1982

[51] Int. Cl.³ .............................................. H01J 40/14
[52] U.S. Cl. ......................... 250/214 AG; 25/214 A
[58] Field of Search ........... 250/206, 214 A, 214 AG; 330/86, 282, 284; 353/26 A

[56] References Cited

U.S. PATENT DOCUMENTS

3,581,223 5/1971 Armstrong .......................... 330/282
3,652,791 5/1972 Shuey ........................... 250/214 AG
4,218,662 8/1980 Schröder ............................. 330/282
4,415,803 11/1983 Muoi ............................. 250/214 AG Primary Examiner—David C. Nelms
Assistant Examiner—J. Brophy
Attorney, Agent, or Firm—Alan H. Haggard; Neal C. Johnson

[57] ABSTRACT

A method and system for automatically calibrating a D.C. transducer are described in the environment of an illustrative film retrieval system. In this system, the output of a transducer such as a light sensor is amplified and the amplified output is compared to upper and lower limits within which it is desired to hold the transducer's amplified output. When either of the limits is exceeded, the amplification of the transducer's output is varied so as to shift its average value to a value which is between the upper and lower limits.

10 Claims, 7 Drawing Figures

AUTOMATIC CALIBRATION FOR D.C. TRANSDUCERS

BACKGROUND OF THE INVENTION

This invention is generally directed to a system for automatically calibrating the output of a D.C. transducer.

Transducers such as photo cells, strain gauges, Hall effect devices and the like generate D.C. output voltages in response to their sensed inputs. Typically, each such transducer has a wide dynamic range (in excess of 1000 to 1) within which it may operate. Because the output signals from such transducers usually have a small magnitude, amplification of the output signals is provided prior to their being further processed. However, the amplifiers and the further processing circuitry for the transducer's output signals generally have a useful dynamic range which is much smaller than the dynamic range of the transducer itself. Hence, the usable range of the transducer becomes limited by the range within which the signal processing circuitry operates. This is one problem which the present invention addresses.

Another problem which conventional transducer calibration systems face is the need for periodic adjustment. For example, a so-called "probe" is used in certain types of retrieval systems in order to optically sense blips or marks on the film as the film is transported. By counting the blips, the film can be positioned for viewing a particular image. Typically, the probe senses a blip by measuring the amount of light which is projected through the film from a light source. As the light source ages or as dust collects on the probe, the probe must be recalibrated to permit accurate sensing of the blips. Analogous problems arise with other types of transducers which also must be recalibrated periodically.

U.S. Pat. No. 2,421,922 describes a technique for automatically recalibrating a probe used in a document reader. In document readers, the documents are transported almost nonstop through the machine, wherefore the probe's sensitivity need not be held at a constant value for a relatively long period of time while the probe's light source is blocked by a document. In contrast, the film in a film retrieval system is frequently parked in one position for a relatively long duration, thus requiring automatic probe calibration of a different type. This difference and the foregoing problems associated with conventional transducer calibration systems illustrate the need for an improved calibration system for D.C. transducers, and particularly for the types of transducers or probes which are used in film retrieval systems.

OBJECTS OF THE INVENTION

It is a general object of the invention to provide an improved method for automatically calibrating a D.C. transducer.

It is a more specific object of the invention to provide a method for automatically shifting the sensitivity of a D.C. transducer to within the dynamic range of circuitry which processes the transducer's amplified output, and for holding the sensitivity fixed indefinitely so long as the transducer's amplified output remains within predetermined limits.

It is another object of the invention to provide an improved system for automatically calibrating probes of the type used to detect blips on film and the like.

BRIEF DESCRIPTION OF THE FIGURES

The objects stated above and other objects of the invention are set forth more particularly in the following detailed description and in the accompanying drawings, of which.

SUMMARY OF THE INVENTION

Broadly stated, the present method for automatically calibrating a D.C. transducer includes amplifying the output of the transducer, establishing upper and lower limits within which it is desired to substantially hold the transducer's sensitivity, and comparing the amplified output to the established upper and lower limits. When either the upper or lower limit is exceeded, the amplification of the transducer's output is slowly varied so as to shift its average value to a value which is between the upper and lower limits.

In the preferred embodiment, the varied amplification of the transducer's output is effected by a digital controller which develops periodic reset pulses and similarly periodic gain-set or sampling pulses. The reset pulses are employed to develop periodic ramp waveforms which are sampled upon each occurrence of a sampling pulse. The value of the sampled ramp waveforms corresponds to a control signal which is used to control the amplification of the transducer's output. When the transducer's amplified output drifts beyond one of the upper and lower limits, the digital controller varies the timing between the reset pulses and the sampling pulses to change the point in time at which the ramp waveform is sampled. Accordingly, the value of the control signal changes to vary the amplification of the transducer's output and shift its average value back to between the upper and lower limits.

DESCRIPTION OF THE PREFERRED EMBODIMENT

The embodiment described below constitutes a primarily digital calibration system for a D.C. transducer. A digital system is preferred because of its ability to remember the transducer's sensitivity for an indefinite period of time. As those skilled in the art will appreciate, the use of digital circuitry to provide a control or calibrating signal for a transducer requires extreme care to avoid introducing ripples in the transducer's output signal. The illustrated embodiment not only provides minimal ripple, but also calibrates the transducer's output signal so as to render it usable within the limited dynamic range of circuitry which processes the transducer's signal.

Figure 1:
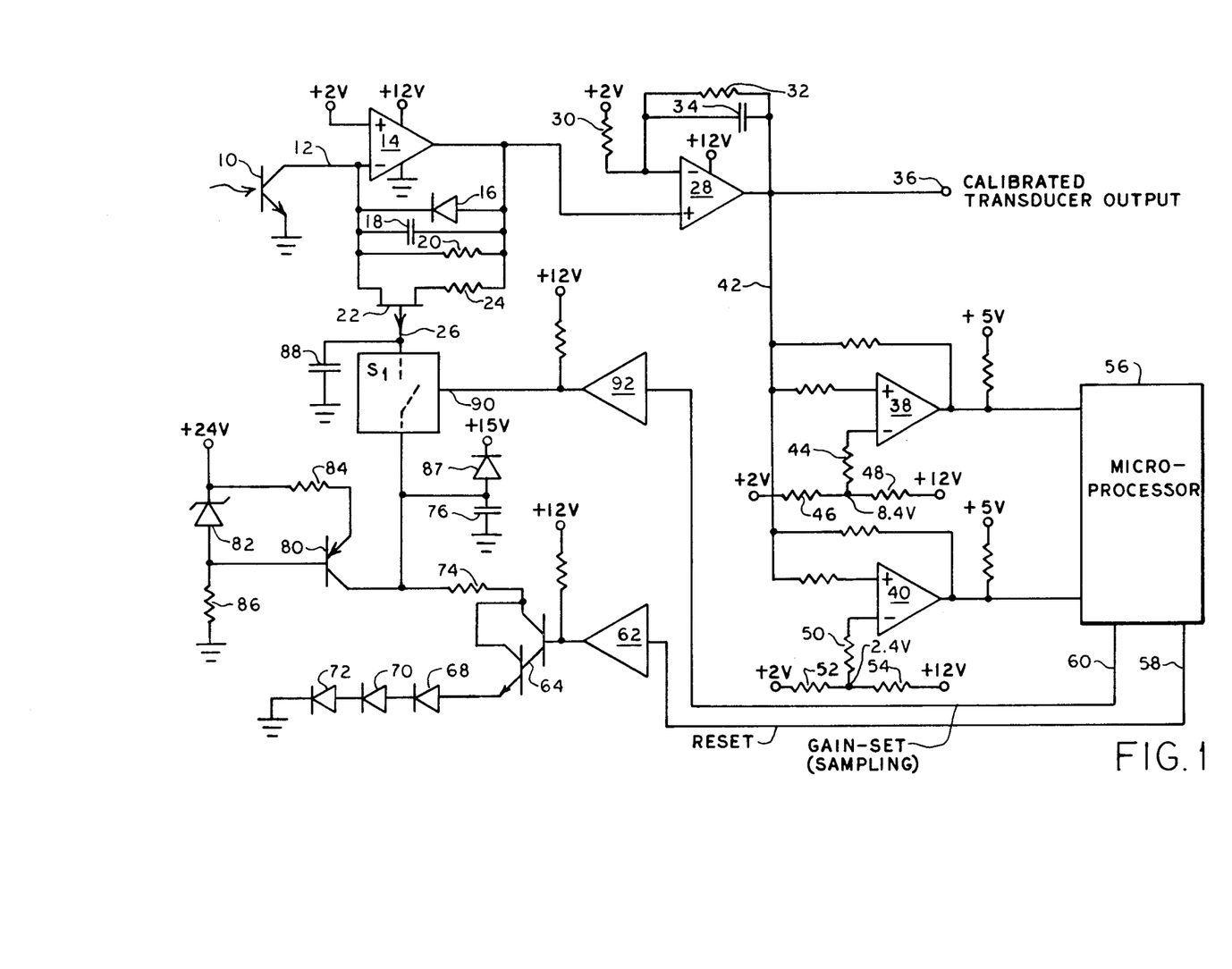
FIG. 1 shows an automatic calibration system for a D.C. transducer of the type used in film retrieval systems.

Referring now to FIG. 1, a system is shown for automatically calibrating the output of a light sensor which is employed as part of a probe in a film retrieval system. It should be understood, however, that the invention embodied in the illustrated system may be employed to calibrate the output of various other types of D.C. transducers.

As shown, a light sensor in the form of a photo transistor 10 senses light to generate a responsive current output signal on a lead 12. This photo transistor may be part of a probe in a film retrieval system in which the light incident on the transistor 10 is interrupted by film blips. The current carried by the lead 12 may be processed for counting such blips and controlling the movement of the film.

The dynamic range of the transistor 10 is typically large enough to respond to light levels which may vary by a factor in excess of 1000. The circuitry which processes the transducer's current output typically has a much smaller dynamic range. To accommodate the limited dynamic range of the circuitry which process the transducer's output, the present system amplifies the output of the transistor 10, compares the amplified output of the transistor to upper and lower limits within which it is desired to substantially hold the amplified transducer output, and varies the amplification of the transistor's output signal so as to shift the average value thereof to a value which is between the selected upper and lower limits.

To amplify the output of the transistor 10, the current carried by the lead 12 is applied to the inverting input of an amplifier 14, the non-inverting input of this amplifier being coupled to a reference voltage source. Coupled between the signal input and the output of this amplifier is a diode 16, a capacitor 18, a resistor 20, and the series combination of an FET (field effect transistor) 22 and a resistor 24. The function of the diode 16 is to improve the amplifier's overload characteristics. The capacitor 18 is selected to improve the stability of the amplifier 14. The maximum gain of the amplifier 14 is limited by the resistor 20, and the minimum gain of the amplifier 14 is limited by the resistor 24.

The function of the FET 22 is to vary the gain of the amplifier 14 within the levels of its maximum and minimum gain. A control signal received via a lead 26 varies the bias on the gate of the FET 22 so as to vary its channel resistance between very low values of resistance and very high values of resistance. As a result of the variance in the channel resistance of the FET 22, the gain of the amplifier 14 is varied to calibrate or adjust the value of its output.

The amplified transducer signal provided at the output of the amplifier 14 is coupled to the non-inverting input of another amplifier 28 whose inverting input is coupled to a voltage source (+2 V, for example) via resistor 30. A feedback resistor 32, coupled in parallel with a capacitor 34, operates in conjunction with the resistor 30 to fix the gain of the amplifier 28 to a selected value.

The output of the amplifier 28 is coupled to a terminal 36 at which the amplified and calibrated output of the transistor 10 appears. This signal at terminal 36 is typically applied to further processing circuitry (not shown) which counts blips sensed by the transistor 10 in order to control the transport of film.

The output of the amplifier 28 is also applied to comparators 38 and 40 via a lead 42 in order to determine whether the transducer's amplified signal is within upper and lower limits of a selected dynamic range. The upper limit in this example corresponds to a reference voltage which is applied to the inverting input of the comparator 38 via a resistor 44. This reference voltage may be established by a divider comprising resistors 46 and 48 which are serially coupled between a 12 volt source and a 2 volt source to develop an upper limit voltage of about 8.4 volts, for example, at the junction between resistors 46 and 48.

The lower limit in this example corresponds to a second reference voltage which is applied to the inverting input of the comparator 40 via a resistor 50. This second reference voltage may be established by a divider comprising resistors 52 and 54 which are serially coupled between the 12 volt source and the 2 volt source to develop a lower limit voltage of about 2.4 volts, for example, at their junction.

Figure 2:
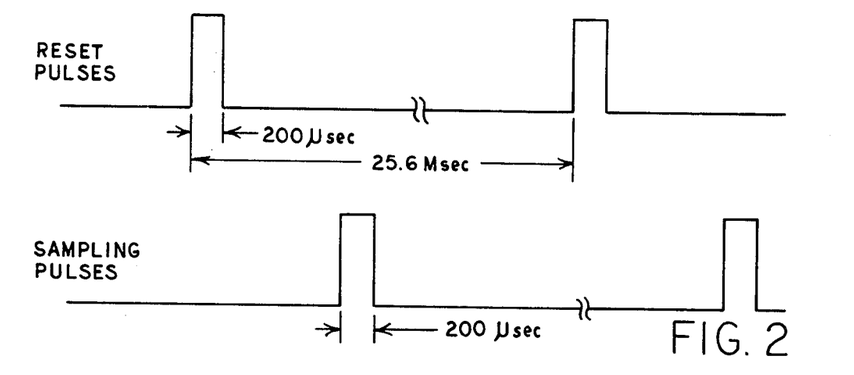
FIG. 2 depicts illustrative reset and gainset (sampling) pulses developed by the microprocessor shown in FIG. 1.

Coupled to the outputs of the comparators 38 and 40 is a digital controller which is preferably a microprocessor 56. In general, the microprocessor develops a first train of periodic pulses (reset pulses) of a constant repetition rate on a lead 58, and a second train of similarly periodic gain-set or sampling pulses on a lead 60. The nature of these pulses may be as shown in FIG. 2. Suffice it to say at this juncture that the microprocessor varies the timing of the sampling pulses relative to the reset pulses in response to the outputs of the comparators 38 and 40.

The reset pulses are coupled to the input of a buffer 62. This buffer's output is coupled to a darlington transistor 64 whose emitter is coupled to ground through serially connected diodes 68, 70 and 72. The collector of transistor 64 is coupled through a resistor 74 to a storage capacitor 76, one side of which is grounded and one side of which is coupled to a constant current source formed by a transistor 80, a zener diode 82, and resistors 84 and 86. With this arrangement, the capacitor 76 is charged and discharged as follows.

Figure 3:
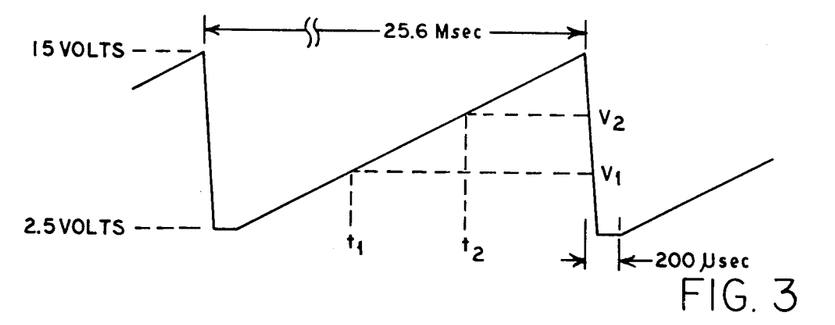
FIG. 3 illustrates a ramp waveform of the type which is developed by the system of FIG. 1 in response to each reset pulse.

Current supplied by the transistor 80 charges the capacitor 76 substantially linearly. Each time a reset pulse is developed, the transistor 64 conducts to rapidly discharge the capacitor 76. Thus, repetitive ramp voltage waveforms are developed across the capacitor 76, one of which is shown in FIG. 3. With the illustrated circuitry and voltage supplies, each ramp waveform rises from approximately 2.5 volts to about 15 volts. The 2.5 volts lower level is established by the diodes 68, 70, 72 and the collector to emitter saturation voltage of the transistor 64. The upper 15 volt level is determined by a 15 volt power supply coupled to the capacitor 76 by a clamping diode 87. As described in more detail below, the ramp waveform on the capacitor 76 is sampled periodically to develop the control signal which is used to vary the bias on the FET 22 to change the gain of the amplifier 14. By changing the time at which the ramp waveform is sampled, the control voltage is varied so as to cause the average value of the light sensor's amplified output signal to be shifted between the upper and lower voltage limits sensed by the comparators 38 and 40. If the average value of the light sensor's amplified output is between those limits, no correction is made to the control signal.

To sample the voltage on the capacitor 76, a bilateral electronic switch S1 is coupled between the capacitor 76 and a second storage capacitor 88. The switch S1 opens and cloes the path between these capacitors in response to a signal applied to its control input 90.

Coupled to the control input 90 is a buffer 92 which receives gain-set (sampling) pulses of fixed width from the microprocessor 56. In response to each such pulse, the buffer 92 drives the control input 90 high to effect closure of the switch S1. Hence, the capacitors 76 and 88 are coupled to each other via the switch S1 for the duration of each gain-set pulse. The capacitor 88 is selected to be much smaller than the capacitor 76 so that the former may rapidly charge or discharge to the value of the ramp voltage. As the time of sampling is varied, the charge on the capacitor 88 varies accordingly. For example, if the switch S1 is momentarily closed at time $t_1$ (FIG. 3), the capacitor 88 becomes charged to V1. If the switch S1 is momentarily closed at time $t_2$, the capacitor 88 charges to V2. The manner in which the system changes the time at which the switch S1 is closed will now be explained with reference to FIG. 1, the timing diagram shown in FIG. 4, and the flow charts depicted in FIGS. 5 and 6.

Figure 4:
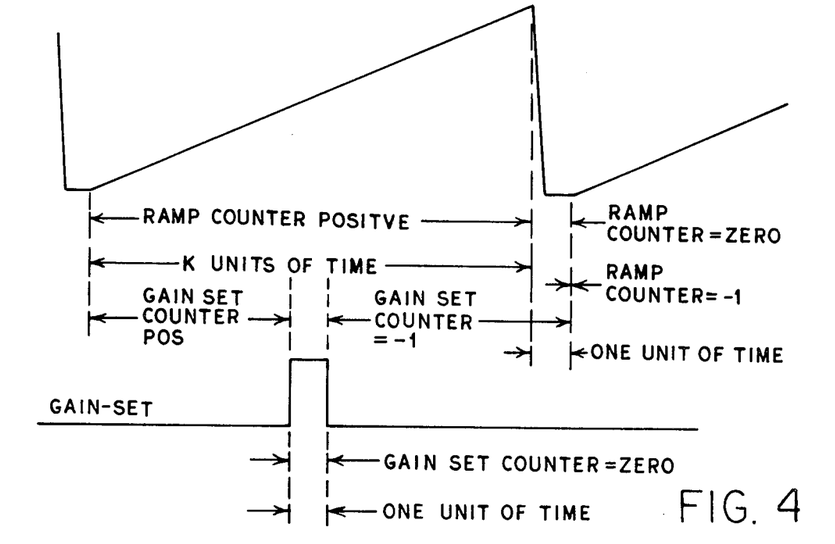
FIG. 4 is a timing diagram illustrating a ramp waveform and various timing intervals useful in explaining the operation of the system.

Referring first to FIG. 4, the ramp waveform which appears on the capacitor 76 and a gain-set or sampling pulse are shown with reference to certain time periods and counter definitions which are used hereinafter. As those skilled in the art will appreciate, the microprocessor 56 includes various counters which, upon reaching one or more preselected counts, cause certain events to occur. For example, a ramp counter is included to control the generation of the ramp waveform, and a gain-set counter is included to control the position of the gain-set pulse for varying the gain of the amplifier 14. As indicated in FIG. 4, the ramp counter contains a positive count during the positive slope of the ramp waveform, it contains a count of zero during each negative slope and its immediately adjacent dwell time, and it reaches a count of minus one just before the beginning of the positive slope of each ramp waveform.

The gain-set counter has a positive count between the initiation of a ramp waveform and the leading edge of the gain-set pulse, a count of zero for the duration of the gain-set pulse, and a count of minus one between the trailing edge of the gain-set pulse and the initiation of the next successive ramp waveform. Of course, the counts of the various counters and the status of the waveforms shown in FIG. 4 are illustrative of one logic system for the microprocessor. Other selected counts may also be used.

Figure 5:
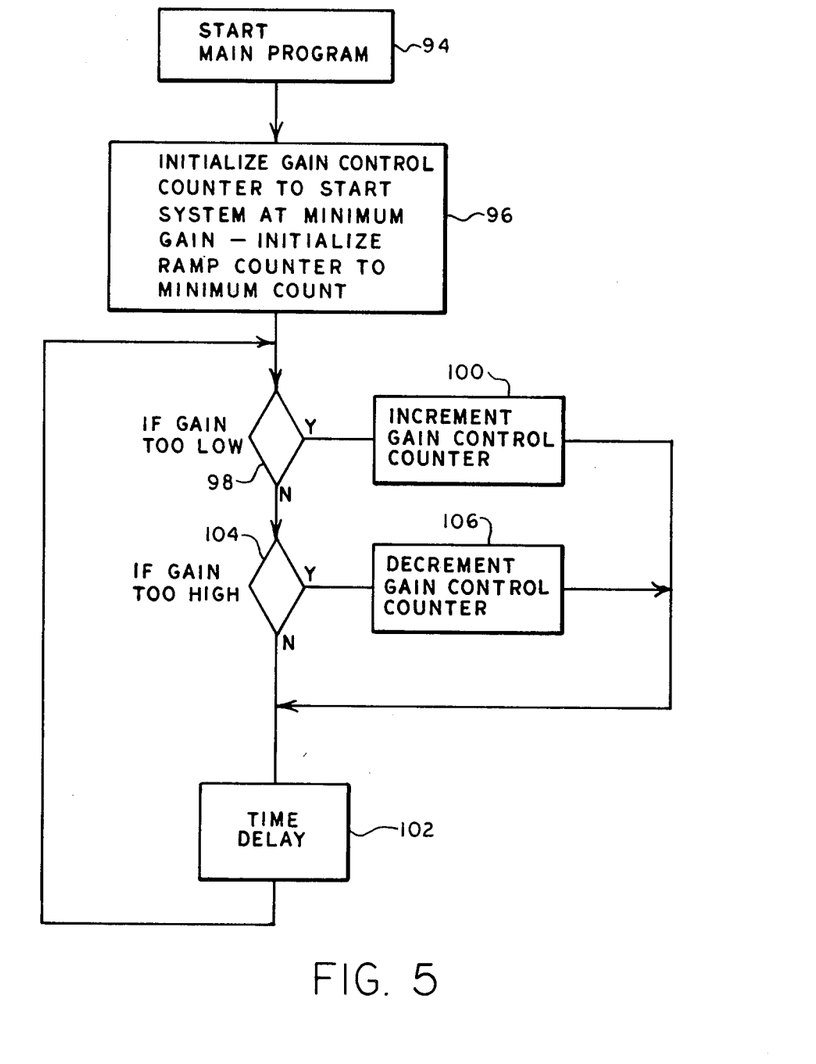
FIGS. 5 and 6 are flow charts illustrating how the microprocessor shown in FIG. 1 may be programmed.

Referring now to FIG. 5, a flow chart is shown for essentially controlling the interval between the initiation of the ramp waveform and the initiation of a gain-set pulse. Following a start instruction 94, a succeeding instruction 96 causes the microprocessor to initialize a gain control counter so as to start the system at minimum gain and to initialize the ramp counter to a minimum count. In effect, the gain-set pulse is positioned to cause sampling of the ramp waveform during its positive slope and at a relatively low value thereof, i.e., shortly after the initiation of the positive slope. By initializing the ramp counter to a minimum count, it is assured that a reset pulse will occur soon to initiate a ramp waveform. In practice, instruction 96 is executed only upon power up of the system.

Instruction 98 determines if the system gain is too low, i.e., whether the output of the comparator 40 is low. If it is, instruction 100 is executed for incrementing the gain by incrementing the count in the gain control counter. An increased count in the gain control counter has the effect of moving the gain-set pulse to the right in FIG. 4 to develop a higher level voltage on the capacitor 88.

Following the execution of instruction 100, the program proceeds to instruction 102 which serves to add a selcted time delay to the system in order to control the rate at which the system's gain can change.

If system gain had been determined as being not too low per instruction 98, the program would then proceed to instruction 104 to determine if system gain is too high, i.e., whether the output of the comparator 38 is high. If it is, instruction 106 is executed to decrement the gain by decrementing the gain control counter. Following the execution of instruction 106, the program proceeds to instruction 102 and then loops back to instruction 98 to again sense the need for a change in system gain. If no such change is needed, the program loops through instructions 98, 104 and 102.

Figure 6:
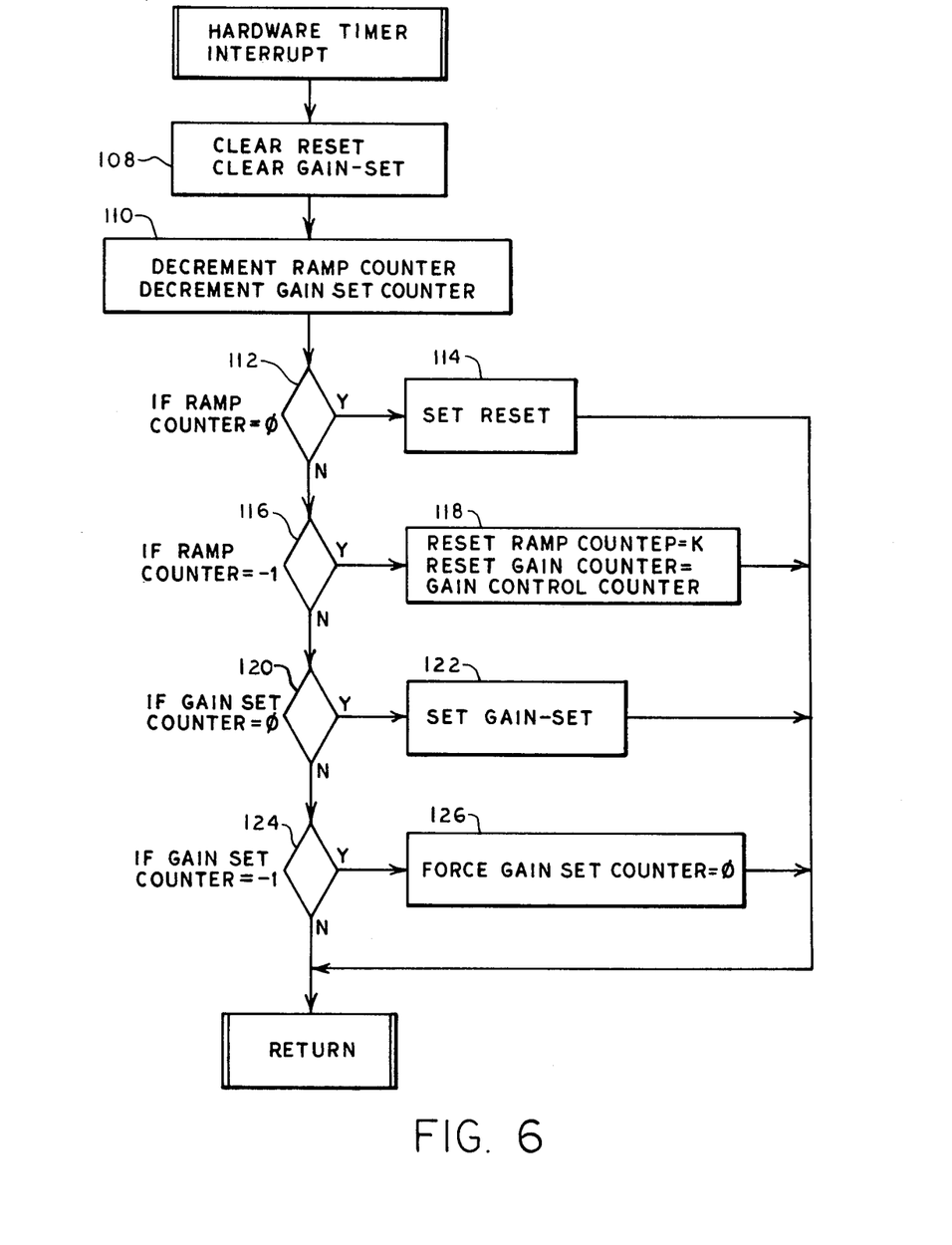

Referring now to FIG. 6, an interrupt program is shown which is executed periodically at a rate of once each two hundred microseconds, for example. The time required for one complete execution of the complete interrupt program may be about one hundred microseconds, for example. The function of this interrupt program is essentially to control the timing of the waveform changes illustrated in FIG. 4.

Instruction 108 of the interrupt program clears the reset (turns transistor 64 off) and clears the gain-set (opens the switch S1). In most cases, the transistor 64 will already be off and the switch S1 will be open prior to executing instruction 108, but this instruction insures a proper status condition from which to complete the interrupt program.

Next, instruction 110 decrements the ramp counter and the gain-set counter. Following this step, instruction 112 inquires as to whether the ramp counter's count equals zero. If a count of zero has been reached, this condition indicates that the ramp waveform has increased to its peak value and is to begin its negative slope. Hence, instruction 114 sets reset, i.e., initiates the reset pulse to drive the input to buffer 62 high for discharging the capacitor 76.

If the ramp counter had not reached zero at the time of executing instruction 112, instruction 116 causes the microprocessor to determine if the count in the ramp counter equals minus one. Such a count indicates the desired end of the negative slope of the ramp waveform, wherefore instruction 118 is executed. By the latter instruction, the ramp counter is reset to a positive value K and the gain-set counter is reset to the gain control counter's value reached during the execution of the main program shown in FIG. 5.

If the ramp counter did not have a count of minus one per instruction 116, the program would have proceeded to instruction 120 to determine whether the gain counter had a count of zero, indicating that a gain-set pulse should be initiated for sampling the ramp waveform. If the gain-set counter has a count of zero, instruction 122 sets the gain-set, i.e., initiates the gain-set pulse to drive high the input to the buffer 92 for closing the switch S1.

If the answer to the inquiry posed by instruction 120 is false, instruction 124 is executed to determine if the gain-set counter has reached a count of minus one, indicating the desired end of the sampling time. If a count of minus one is sensed, the program proceeds to instruction 126 to set the gain-set counter to zero to ensure that the gain-set counter will again be at a count of minus one on the next pass through this program. This has the effect of holding this counter inactive until the next ramp reset.

If the gain-set counter was not sensed to have had a count of minus one upon the execution of instruction 124, this indicated that the gain-set counter had a positive count and that sampling is premature. In that case, the program is finished until the next interrupt.

It can be seen, therefore, that the microprocessor repeatedly senses the outputs of the comparators 38 and 40, varies the gain of the system by varying the position of the gain-set pulses, and causes the capacitor 76 to be discharged at the appropriate time. The effect of varying the gain of the system is shown generally by the waveforms A, B, C and D of FIG. 7.

Figure 7:
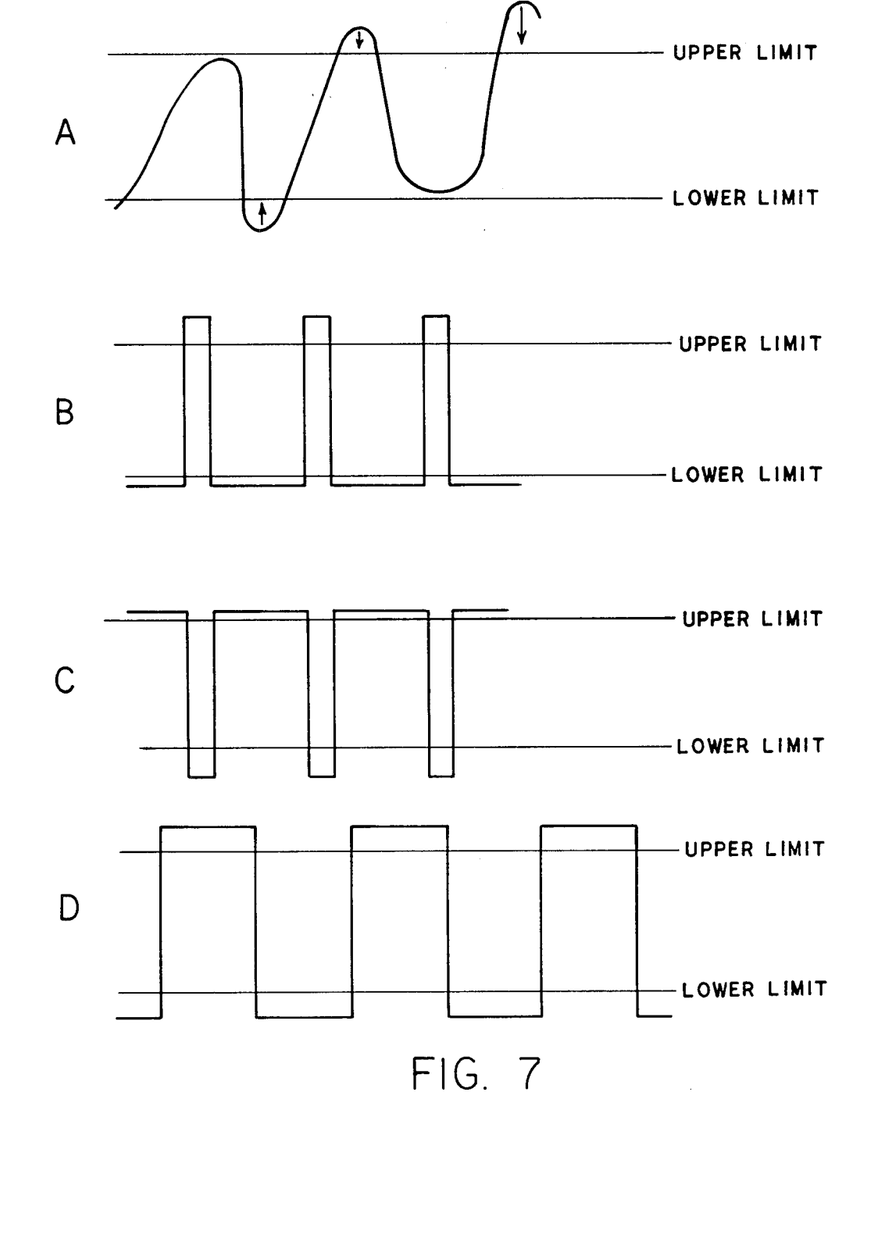
FIG. 7 shows four exemplary transducer outputs and the manner in which the average values of those outputs are shifted to between upper and lower limits.

Referring to the waveform A, the amplified output of the transducer is shown as varying between and sometimes exceeding the upper and lower limits applied to the comparators 38 and 40. Each time one such limit is exceeded, the gain of the amplifier 14 is changed to shift the average value of the transducer's output signal in the direction indicated by the arrows. It should be understood that the illustrated upward drift in the transducer's output signal generally occurs over a very long time period and may be due to component aging, environmental changes and the like.

Referring now to waveform B, the transducer's amplified output signal is shown as a succession of rectangular pulses as might be developed by sensing blips on microfilm. Even though the upper portions of each pulse may extend somewhat beyond the upper limit the average value thereof is held by the system to between the upper and lower limits.

When the pulse outputs from the transducer are as shown in waveform C, the lower extremities thereof may extend somewhat below the lower limit. Their average value, however, is shifted and held between the upper and lower limits.

In the case where the transducer generates a large square wave as shown in waveform D, both the upper and lower extremities thereof may extend somewhat beyond the upper and lower limits. The average value in this example is shifted to a point midway between the upper and lower limits.

The calibration system described above provides accurate and reliable compensation of variations in the outputs of a variety of D.C. transducers. Field adjustments are virtually eliminated while the range of the transducer's output signals are assured of being held to within a preselected range.

Although the invention has been described in terms of a preferred embodiment and preferred steps, it will be obvious to those skilled in the art that many alterations and variations may be made without departing from the invention. Accordingly, it is intended that all such alterations and variations be considered as within the spirit and scope of the invention as defined by the appended claims.

What is claimed is:

1. In a system employing a D.C. transducer whose output is variable over a relatively wide dynamic range, a method for automatically calibrating the transducer's output to hold it within a predetermined range, comprising:
   amplifying the output of the transducer;
   establishing an upper limit and a lower limit within which it is desired to substantially hold the amplified output of the transducer;
   comparing the amplified output of the trasnsducer to said upper and lower limits; and
   varying the amplification of the transducer's ouput signal so as to shift its average value to a value which is between said upper and lower limits.

2. A method as set forth in claim 1 wherein the step of varying the amplification of the transducer's output signal includes:
   developing a periodic ramp waveform;
   sampling the ramp waveform periodically to develop a control signal which is substantially equal to the sampled value of the ramp waveform;
   changing the amplification of the transducer's output signal according to the value of the control signal; and
   varying the time of sampling the ramp waveform in response to the average value of the transducer's amplified output signal being beyond one of said first and second limits so as to vary the value of the control signal.

3. A method as set forth in claim 2 wherein the periodic ramp waveform is developed by:
   generating a first train of periodic pulses; and
   charging and discharging a first storage capacitor in response to the first train of pulses.

4. A method as set forth in claim 3 wherein the ramp waveform is sampled by:
   generating a second train of periodic pulses; and
   charging a second storage capacitor by coupling the voltage on the first storage capacitor to the second storage capacitor in response to each pulse in the second train of pulses.

5. A method as set forth in claim 4 wherein the first and second trains of pulses are developed at the same periodic rate, and wherein the time of sampling the ramp waveform is varied by varying the position of pulses in the second train of pulses relative to the position of pulses in the first train of pulses.

6. In a system employing a light sensor to detect blips on microfilm, a method for automatically calibrating the light sensor's output to hold it within a predetermined range, comprising:
   amplifying the output of the light sensor;
   establishing an upper limit and a lower limit within which it is desired to substantially hold the amplified output of the light sensor;
   comparing the amplified output of the light sensor to said upper and lower limits;
   generating a periodic ramp waveform;
   sampling the ramp waveform periodically to develop a control signal whose value is proportional to the sampled value of the ramp waveform;
   modifying the time of sampling the ramp waveform in response to the amplified output of the light sensor being beyond one of said upper and lower limits so as to vary the value of the control signal; and
   varying the amplification of the light sensor's output by means of the control signal to shift the average value of the light sensor's amplified output to a value which is between said upper and lower limits.

7. A method as set forth in clam 6 wherein said periodic ramp waveform is developed by generating a first train of periodic pulses and by charging and discharging a first storage capacitor in response to each such pulse, wherein the ramp waveform is sampled by generating a second train of periodic pulses and by charging a second storage capacitor by coupling the first storage capacitor to the second storage capacitor in response to each pulse in the second train of pulses, and wherein the sampling time is varied by varying the relative position of pulses in said first and second trains of pulses.

8. In a system employing a light sensor to detect blips on microfilm, an automatic calibration system for the light sensor, comprising:

a variable gain amplifier for amplifying the output of the light sensor;

a first comparator for comparing the output of the amplifier to an upper limit value;

a second comparator for comparing the output of the amplifier to a lower limit value;

a digital controller for generating first and second trains of periodic pulses, the controller being responsive to the comparators sensing that the upper or lower limit values are exceeded for varying the position of pulses in the second train relative to the position of pulses in the first train;

means including a first storage capacitor for converting pulses in the first train to ramp waveforms;

means, including a second storage capacitor, responsive to each pulse in the second train for sampling the ramp waveforms and for storing on the second storage capacitor a control voltage substantially corresponding to the sampled value of the ramp waveform; and means responsive to the control voltage for varying the gain of said amplifier so as to shift the average value of its output to a value which is between said upper and lower limits.

9. A system as set forth in claim 8 wherein said means for sampling the ramp waveforms includes an electronic switch for coupling the first storage capacitor to the second storage capacitor in response to each pulse in the second train of pulses.

10. A system as set forth in claim 9 wherein said means for varying the gain of the amplifier includes a field effect transistor having one electrode coupled to the amplifier's input, having another electrode coupled to the amplifier's output, and having a gate electrode receiving the control voltage.

* * * * *